United States Patent
Kasuya et al.

(10) Patent No.: US 10,903,037 B2
(45) Date of Patent: Jan. 26, 2021

(54) CHARGED PARTICLE BEAM DEVICE

(71) Applicant: HITACHI HIGH-TECH CORPORATION, Tokyo (JP)

(72) Inventors: Keigo Kasuya, Tokyo (JP); Shuhei Ishikawa, Tokyo (JP); Kenji Tanimoto, Tokyo (JP); Hajime Kawano, Tokyo (JP); Hideo Todokoro, Tokyo (JP); Souichi Katagiri, Tokyo (JP); Takashi Doi, Tokyo (JP); Soichiro Matsunaga, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/572,999

(22) Filed: Sep. 17, 2019

(65) Prior Publication Data

US 2020/0090897 A1 Mar. 19, 2020

(30) Foreign Application Priority Data

Sep. 18, 2018 (JP) ................................. 2018-173322

(51) Int. Cl.
*H01J 37/075* (2006.01)
*H01J 37/28* (2006.01)

(52) U.S. Cl.
CPC ............. *H01J 37/075* (2013.01); *H01J 37/28* (2013.01); *H01J 2237/0473* (2013.01)

(58) Field of Classification Search
CPC ........................... H01J 37/06–077; H01J 37/28
See application file for complete search history.

(56) References Cited

U.S. PATENT DOCUMENTS

| | | | |
|---|---|---|---|
| 4,295,072 A | 10/1981 | Todokoro et al. | |
| 2006/0076489 A1* | 4/2006 | Ohshima | H01J 37/28 250/310 |
| 2011/0089336 A1* | 4/2011 | Kasuya | H01J 1/304 250/424 |
| 2012/0085925 A1* | 4/2012 | Kasuya | H01J 37/3174 250/453.11 |
| 2012/0217391 A1* | 8/2012 | Shichi | H01J 37/08 250/306 |
| 2014/0299768 A1* | 10/2014 | Shichi | H01J 37/28 250/310 |
| 2017/0309437 A1* | 10/2017 | Agemura | H01J 37/28 |
| 2019/0279837 A1* | 9/2019 | Onishi | H01J 37/16 |

FOREIGN PATENT DOCUMENTS

| | | | | |
|---|---|---|---|---|
| JP | S55-01062 A | | 1/1980 | |
| JP | 58140960 A | * | 8/1983 | ............ H01J 37/073 |
| WO | WO-2018055715 A1 | * | 3/2018 | ................ H01J 7/18 |

* cited by examiner

*Primary Examiner* — Mariceli Santiago
(74) *Attorney, Agent, or Firm* — Miles & Stockbridge, P.C.

(57) ABSTRACT

An object of the invention is to stably supply an electron beam from an electron gun, that is, to prevent variation in intensity of the electron beam. The invention provides a charged particle beam device that includes an electron gun having an electron source, an extraction electrode to which a voltage used for extracting electrons from the electron source is applied, and an acceleration electrode to which a voltage used for accelerating the electrons extracted from the electron source is applied, a first heating unit that heats the extraction electrode, and a second heating unit that heats the acceleration electrode.

13 Claims, 12 Drawing Sheets

RELATIONSHIP BETWEEN SCATTERING ANGLE
AND INTENSITY OF REFLECTED ELECTRONS

CHARGED PARTICLE BEAM DEVICE

CLAIM OF PRIORITY

The present application claims priority from Japanese Patent Application JP 2018-173322 filed on Sep. 18, 2018, the content of which are hereby incorporated by references into this application.

BACKGROUND OF THE INVENTION

1. Field of the Invention

The present invention relates to a charged particle beam device, and more particularly to an electron gun that supplies an electron beam applied to a sample.

2. Description of the Related Art

A charged particle beam device is a device that generates an image used for observing a sample by irradiating the sample with a charged particle beam such as an electron beam and detecting transmission electrons, secondary electrons, reflected electrons, x-rays, and the like that are emitted from the sample. An image quality of the generated image depends on the electron beam applied to the sample, and an electron gun capable of stably supplying a high luminance electron beam is required to obtain a clear and bright image with high spatial resolution at high speed and with good reproducibility. As such an electron gun, there are a Cold Field Emission Electron Gun (hereinafter referred to as CFE electron gun) and a Schottky Emission Electron Gun (hereinafter referred to as SE electron gun). Although the CFE electron gun is used at a room temperature compared with the SE electron gun used after heating, it is necessary to maintain the periphery of a cathode at an extremely high vacuum of $10^{-9}$ Pa or less in order to stably supply the electron beam. A high degree of vacuum means that an atmospheric pressure value in a vacuum chamber is small.

JP-A-S55-1062 (Patent Literature 1) discloses that a heater is used to heat an extraction electrode to which a voltage used for extracting electrons from a cathode is applied and a chamber having a cathode and a chamber having a heater are independently evacuated in order to maintain the periphery of the cathode at an extremely high vacuum even during electron beam irradiation.

However, although Patent Literature 1 focuses on gas emitted from an extraction electrode or a heater, there is no mention of gas, ions and electrons that are emitted from an acceleration electrode to which a voltage used for accelerating an electron extracted from a cathode which is an electron source is applied. The gas, the ions, and the electrons that are emitted from the acceleration electrode reduce a degree of vacuum around the electron source, vary intensity of an electron beam supplied from an electron gun, and prevent stable electron beam supply.

SUMMARY OF THE INVENTION

An object of the invention is to stably supply an electron beam from an electron gun, that is, to prevent variation in intensity of an electron beam.

In order to achieve the above object, the invention provides a charged particle beam device that includes an electron gun having an electron source, an extraction electrode to which a voltage used for extracting electrons from the electron source is applied, and an acceleration electrode to which a voltage used for accelerating the electrons extracted from the electron source is applied, a first heating unit that heats the extraction electrode, and a second heating unit that heats the acceleration electrode.

According to the invention, the electron beam from the electron gun can be stably supplied, that is, variation in the intensity of the electron beam can be prevented.

DESCRIPTION OF THE PREFERRED EMBODIMENTS

Hereinafter, embodiments of a charged particle beam device according to the invention will be described with reference to the drawings. The charged particle beam device is a device that generates an image used for observing a sample by irradiating the sample with a charged particle beam and detecting secondary particles emitted from the sample. For example, there are various devices that generate an image of the sample by irradiating the sample with an electron beam, such as a scanning electron microscope and a transmission electron microscope. Hereinafter, a scanning electron microscope will be described as an example of the charged particle beam device.

First Embodiment

Figure 1:
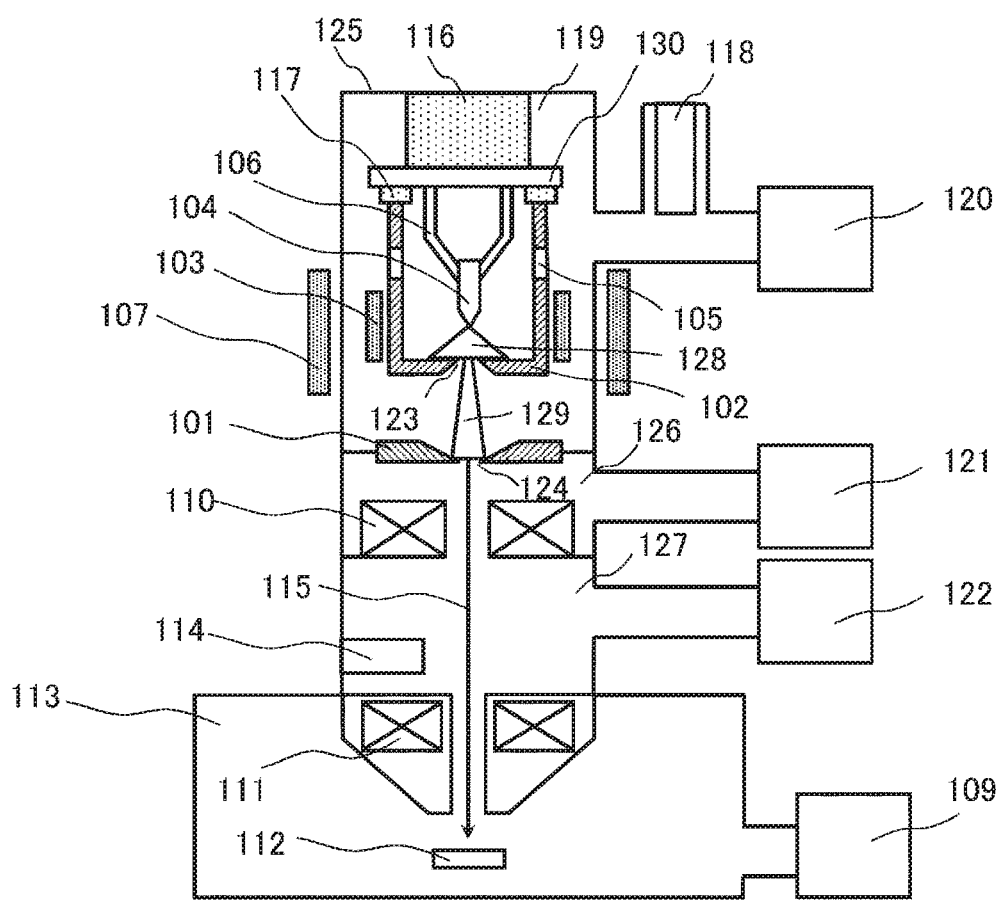
FIG. 1 is a schematic view of a scanning electron microscope which is an example of a charged particle beam device according to a first embodiment.

An overall configuration of a scanning electron microscope according to the present embodiment will be described with reference to FIG. 1. The scanning electron microscope is a device that observes a sample by irradiating the sample with an electron beam and detecting secondary electrons, reflected electrons, and the like that are emitted from the sample. An image for observation is generated by associating a position irradiated with the electron beam with a detected amount of the secondary electrons and the like by scanning the sample with a focused electron beam. The scanning electron microscope includes a cylindrical body 125 and a sample chamber 113, and the inside of the cylindrical body 125 is divided into a first vacuum chamber 119, a second vacuum chamber 126, and a third vacuum chamber 127. Each chamber will be described below.

The first vacuum chamber 119 is evacuated by an ion pump 120 and a Non-Evaporable Getter (NEG) pump 118, and is brought to an extremely high vacuum of $10^{-8}$ Pa or less, more preferably $10^{-9}$ Pa to $10^{-10}$ Pa. An outer heater 107 is provided outside the first vacuum chamber 119, and an electron gun is housed in the first vacuum chamber 119. The electron gun supplies an electron beam 115 applied to a sample 112, and includes an electron source 104, an extraction electrode 102, and an acceleration electrode 101. Each unit of the electron gun will be described below.

The electron source 104 is, for example, a single crystal tungsten sharpened to nanometer order, and electrons are extracted by concentrating an electric field at a tip end of the electron source 104. The electron source 104 is connected to a filament 106 and the filament 106 is supported by a holder 130. The electron source 104, the filament 106, and the holder 130 are at the same potential. The holder 130 is attached to the cylindrical body 125 via an insulator 116, and is electrically insulated from the cylindrical body 125, which is at a ground potential, by the insulator 116.

The extraction electrode 102 has a cup shape covering the electron source 104, and has an opening 123 with a diameter of about 0.1 mm to 10 mm at a center of a surface facing the electron source 104. Since a voltage is applied between the extraction electrode 102 and the electron source 104, the holder 130 which has the same potential as the electron source 104 and the extraction electrode 102 are electrically insulated by an insulator 117. An exhaust port 105 having an exhaust conductance sufficiently larger than that of the opening 123 is provided on a side surface of the extraction electrode 102, and the periphery of the electron source 104 is maintained at a high degree of vacuum by evacuation from the exhaust port 105. A heater 103 is provided around the extraction electrode 102 so as to avoid the exhaust port 105.

The acceleration electrode 101 is a metal annular ring having an opening 124 with a diameter of about 0.1 mm to 10 mm at a center, and is disposed below the extraction electrode 102 to separate the first vacuum chamber 119 from the second vacuum chamber 126. A configuration of the acceleration electrode 101 will be described later with reference to FIG. 2.

The second vacuum chamber 126 is evacuated by an ion pump 121. The second vacuum chamber 126 is connected to the first vacuum chamber 119 via the opening 124 of the acceleration electrode 101, and a pressure difference with the differentially evacuated first vacuum chamber 119 is about 100 times. A condenser lens 110 is disposed in the second vacuum chamber 126. Two or more condenser lenses 110 may be disposed as necessary. Further, the condenser lens 110 separates the second vacuum chamber 126 from the third vacuum chamber 127.

The third vacuum chamber 127 is evacuated by an ion pump 122. The third vacuum chamber 127 is differentially evacuated to the second vacuum chamber 126 connected via the condenser lens 110. A detector 114 is disposed in the third vacuum chamber 127.

The sample chamber 113 is evacuated by a turbo molecular pump 109. The sample 112 and an objective lens 111 are disposed in the sample chamber 113, and the objective lens 111 separates the third vacuum chamber 127 from the sample chamber 113. The sample chamber 113 is differentially evacuated to the third vacuum chamber 127 connected via the objective lens 111.

Next, a process from extraction of electrons from the electron source 104 to generation of the image for observation will be described. By applying a voltage of about 1 kV to 6 kV as an extraction voltage between the electron source 104 and the extraction electrode 102, electrons are extracted as a total current 128 from the tip end of the electron source 104 where the electric field is concentrated. A part of the radially extracted total current 128 passes through the opening 123 to become an electron beam 129, and the electron beam 129 travels below the extraction electrode 102.

By applying a voltage of typically 1 kV to 30 kV, more preferably about 30 kV to about 60 kV as an acceleration voltage between the electron source 104 and the acceleration electrode 101, the electron beam 129 is accelerated. As the acceleration voltage is higher, a bottom of the sample 112 can be observed even when the sample 112 has a three-dimensionally intricate structure with a deep hole or a deep groove. In addition, since an amount of reflected electrons emitted from the sample 112 increases, the image for observation becomes clear.

A part of the accelerated electron beam 129 passes through the opening 124 and travels to the second vacuum chamber 126 as the electron beam 115. The electron beam 115 is focused by the condenser lens 110 and passes through an objective aperture (not shown), so that an amount of current and an opening angle with which the sample 112 is irradiated are adjusted. Thereafter, the electron beam 115 is further focused by the objective lens 111 and deflected by a deflection coil (not shown) to scan the sample 112.

The secondary electrons and reflected electrons are emitted from the sample 112 scanned with the electron beam 115. By detecting the emitted secondary electrons and reflected electrons by the detector 114, the image for observation is generated.

The total current 128 that cannot be the electron beam 129 collides with the extraction electrode 102 to cause Electron Stimulated Desorption (hereinafter referred to as ESD). A part of the electron beam 129 that cannot pass through the opening 124 as the electron beam 115 also collides with the acceleration electrode 101 to cause ESD. By ESD, atoms, molecules, ions are excited from the extraction electrode 102 and the acceleration electrode 101 and are emitted into a vacuum, and at the same time, the reflected electrons are generated.

The emitted atoms and molecules are called ESD gas, which reduces a degree of vacuum in the electron gun, adheres to the electron source 104, and changes the amount of electrons extracted from the electron source 104, thus hindering stable electron beam supply.

The emitted ions are accelerated by a potential difference between the extraction electrode 102, the acceleration electrode 101, the electron source 104, and the like and collide with the electron source 104, the filament 106, and the holder 130 to generate a large amount of gas and secondary electrons. The generated secondary electrons move toward the extraction electrode 102 and the acceleration electrode 101 while being accelerated and react with the ESD gas and the like to further generate ions. Repeated generation of secondary electrons and generation of ions causes the ions and the secondary electrons to increase avalanchely between the electrodes, thereby causing discharge between the electrodes. The discharge between the electrodes changes a potential of a space and changes the amount of electrons extracted from the electron source 104, which hinders stable electron beam supply. Further, in some cases, the electron source 104 is damaged by the discharge, and the electrons cannot be extracted.

Further, the reflected electrons generated from the extraction electrode 102 and the acceleration electrode 101 spread in the electron gun and collide with the electron source 104, the extraction electrode 102, and the acceleration electrode 101 to further generate ESD gas, ions, and reflected electrons. A part of the secondary and tertiary generated reflected electrons collides with an insulating material such as the insulator 117 to charge the insulator 117 and the like. A charge amount changes with time, and when a predetermined charge amount is reached, micro discharge occurs. Since the micro discharge changes the potential of the space and changes the amount of electrons extracted from the electron source 104, the stable electron beam supply is hindered. In addition, the electron source 104 may be damaged by the micro discharge.

Therefore, in the present embodiment, the extraction electrode 102 is heated by the heater 103 and the entire electron gun is heated by the outer heater 107, so that gas on the surfaces and inside of the extraction electrode 102 and the acceleration electrode 101 is thermally desorbed to clean the extraction electrode 102 and the acceleration electrode 101. By cleaning the acceleration electrode 101 together with the extraction electrode 102, even when ESD occurs in the extraction electrode 102 and the acceleration electrode 101, emission of the ESD gas, the ions, and the reflected electrons can be prevented, and the electron beam from the electron gun can be stably supplied.

Further, since the extraction electrode 102 has a cup structure covering the electron source 104, the reflected electrons emitted from the extraction electrode 102 are confined inside the extraction electrode 102 and cannot substantially reach the insulator 117 and the like, and the micro discharge does not occur.

Further, since a decrease in the degree of vacuum in the electron gun is prevented by preventing the emission of the ESD gas from the acceleration electrode 101, the electron source 104 and the acceleration electrode 101 can be disposed in the same first vacuum chamber 119 and evacuated by the single ion pump 120. That is, the periphery of the electron source 104 can be maintained at an extremely high vacuum without adopting a differential evacuated structure in which evacuation is performed by a separate vacuum pump as in Patent Literature 1. Since the ion pump is heavy in weight and generates a magnetic field, mechanically vibrating the electron gun or bending the electron beam 115 degrades the image for observation. However, according to the present embodiment, since the number of required ion pumps are reduced, an adverse effect on the image can be reduced, and the size and cost of the scanning electron microscope can be reduced.

A feature of each configuration according to the present embodiment and an effect obtained by the feature will be described below. Since the extraction electrode 102 has a planar portion facing the electron source 104 and a sufficiently small opening 123 with respect to the planar portion, and has a cup structure covering the electron source 104, the potential outside the extraction electrode 102 is prevented from entering the inside of the extraction electrode 102. As a result, the electric field at the tip end of the electron source 104 is uniquely determined by the extraction voltage, and the reproducibility of the amount of total current 128 is maintained. Therefore, since the extraction voltage is uniquely determined with respect to the current of the electron beam 115 applied to the sample 112, an electrostatic lens function is also uniquely determined. As a result, the reproducibility of the image for observation of the sample 112 is maintained.

Since the acceleration electrode 101 also has a planar portion with respect to the extraction electrode 102, a potential is formed by a parallel plate, and the potential between the electrodes is uniquely determined according to the acceleration voltage. Therefore, the electrostatic lens function is uniquely determined, and the reproducibility of the image for observation is maintained.

Further, a Butler lens structure provided with tapered shapes facing each other around the opening 123 and the opening 124 may be adopted. With the Butler lens structure, aberration of the electrostatic lens function formed by both electrodes can be reduced, and a decrease in resolution due to blurring of the electron beam 115 can be prevented.

In addition, since the insulator 117 that electrically insulates the extraction electrode 102 and the holder 130 only needs to be able to withstand an extraction voltage of at most 6 kV, it is not necessary to make the insulator 117 longer. Therefore, even when the acceleration voltage exceeds 30 kV, only the insulator 116 needs to be long, and an acceleration voltage of 30 kV or more can be realized with a relatively small size and low cost configuration.

Further, since the emission of ESD gas, ions from the acceleration electrode 101 and the dissipation of reflected electrons can be prevented, the electron beam can be stably supplied even when the electron beam from the electron gun has a large current and the acceleration voltage is high. For example, even when the total current 128 is 30 μA or more, more preferably 50 μA or more, a pressure rise of the first vacuum chamber 119 remains $10^{-10}$ Pa or less. Further, even when the acceleration voltage is 30 kV or more, more preferably 45 kV or more, the pressure rise and the discharge do not occur, and the electron beam can be stably supplied. According to the configuration of the present embodiment, the electron gun with large current and high acceleration can be realized, the image generated by the scanning electron microscope can be clarified, observation time can be accelerated, and a deep bottom of a deep hole can be observed with good reproducibility.

Further, since the emission of ESD gas and ions from the acceleration electrode 101 and the dissipation of reflected electrons can be prevented, a distance between the tip end of the electron source 104 and the extraction electrode 102 may be narrowed. By narrowing the distance between the electron source 104 and the extraction electrode 102, the electrostatic lens formed between the extraction electrode 102 and the acceleration electrode 101 can be used at a short focus, and a decrease in luminance due to the aberration, deterioration of controllability at the time of axis deviation, and deterioration of the controllability of a virtual light source position can be prevented. From a viewpoint of the controllability of the virtual light source position, the distance between the tip end of the electron source 104 and the extraction electrode 102 is preferably 5 mm or less, more preferably 2 mm or less. With such a distance, when the acceleration voltage is greater than 30 kV, and even more preferably 45 kV or more, no actual light source is formed, and the electron gun can be practically used even under a high acceleration condition.

Further, when the extraction voltage is low, a focusing function of the electrostatic lens becomes strong and the actual light source is displayed so that the electron microscope cannot be used. Therefore, when a value of the extraction voltage is V1 and a value of the acceleration voltage is V0, the distance between the tip end of the electron source 104 and the extraction electrode 102 is set to 10 mm or less in the electron gun used under a condition of V0/V1≤10. Further, in the electron gun also temporarily used under a condition of 10≤V0/V1≤15, the distance between the tip end of the electron source 104 and the extraction electrode 102 is set to 5 mm or less. In the electron gun also temporarily used under a condition of 15≤V0/V1≤25, the distance between the tip end of the electron source 104 and the extraction electrode 102 is set to 2 mm or less. In the electron gun also temporarily used under a condition of V0/V1≥25, the distance between the tip end of the electron source 104 and the extraction electrode 102 is set to 1 mm or less. In particular, when a material having a work function of 3.0 eV or less, for example, $LaB_6$ or $CeB_6$, nanowire or nanotube is used for the electron source 104, the extraction voltage becomes low, which makes it difficult to control the position of the virtual light source. Therefore, in the electron source 104 which uses the material having the work function of 3.0 eV or less, it is preferable to set the distance between the tip end of the electron source 104 and the extraction electrode 102 according to the above condition.

Further, since the emission of ESD gas and ions from the acceleration electrode 101 and the dissipation of reflected electrons can be prevented, the electron beam can be stably supplied even when the opening 123 of the extraction electrode 102 is enlarged. When the size of the opening 123 is, for example, 1 mm or more, more preferably 2 mm or more, an axial adjustment of the lens of the extraction electrode 102 in a subsequent stage becomes easy, so that operation time of a user is shortened, and the usability of the scanning electron microscope can be improved.

Figure 2:
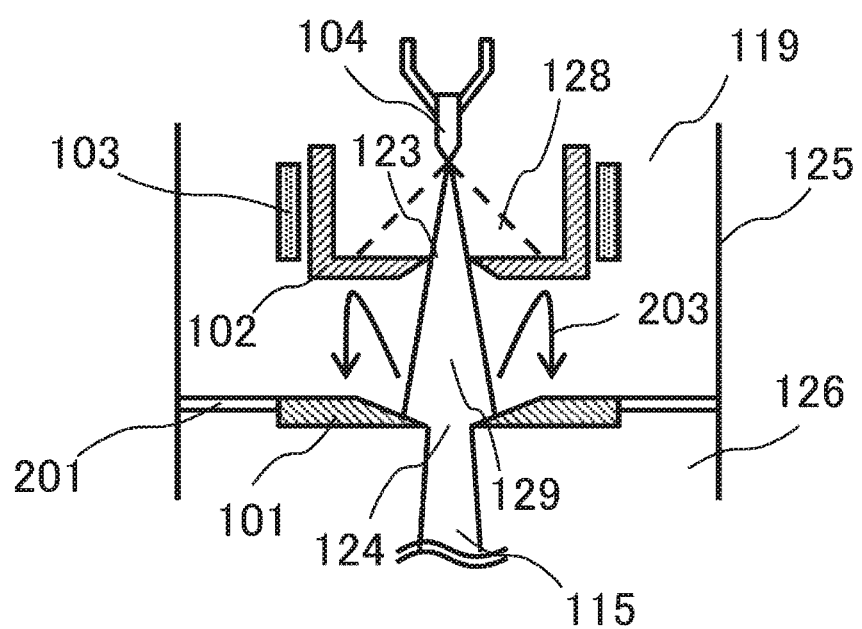
FIG. 2 is a schematic view showing a configuration of the periphery of an acceleration electrode according to the first embodiment.

A configuration of the acceleration electrode 101 will be described with reference to FIG. 2. The acceleration electrode 101 is connected to the cylindrical body 125 via a heat insulating portion 201 disposed on the outer periphery of the acceleration electrode 101. The heat insulating portion 201 is a member that prevents heat transfer from the acceleration electrode 101 to the cylindrical body 125.

The heat insulating portion 201 is formed of a material having a low thermal conductivity, and is typically formed of a material having a thermal conductivity of 40 W/mK or less, more preferably 20 W/mK or less, such as SUS, titanium, a titanium alloy, alumina, zirconia. The heat insulating portion 201 is preferably formed of Ti-6Al-4V or the like which is a material having a thermal conductivity of 10 W/mK or less. When the heat insulating portion 201 is formed of an insulating material, a surface thereof is coated with metal or the heat insulating portion 201 is disposed at a position where the electron beam 129 cannot collide with the heat insulting portion 201 to prevent the heat insulating part 201 from being charged.

A thickness of the heat insulating portion 201 is typically 5 mm or less, more preferably 2 mm or less. In addition, a heat insulating property may be improved by making a hole in the heat insulating portion 201 to narrow an area of a heat conducting path. The heat insulating property increases as the thickness of the heat insulating portion 201 is thinner, but mechanical strength decreases. Therefore, the mechanical strength may be reinforced by forming a structure having symmetry with respect to a central axis such as a cylinder or a disk.

By disposing the heat insulating portion 201 on the outer periphery of the acceleration electrode 101, heating of the acceleration electrode 101 is promoted. For example, when the extraction electrode 102 is heated by the heater 103 and reaches a high temperature of about 300° C. to about 700° C., radiant heat from the extraction electrode 102 reaches the opposite acceleration electrode 101. Although the radiant heat from the extraction electrode 102 is small, the heat transfer to the cylindrical body 125 is prevented by providing the heat insulating portion 201, so that the heating of the acceleration electrode 101 is promoted. By heating the acceleration electrode 101 to a higher temperature, the gas on the surface and inside of the acceleration electrode 101 is thermally desorbed to clean the acceleration electrode 101. An emission amount of ESD gas or ions emitted from the acceleration electrode 101 can be reduced by an order of magnitude by a temperature rise of about 100° C.

In addition, since the extraction electrode 102 and the acceleration electrode 101 have planar portions facing each other, an area where the extraction electrode 102 emits the radiant heat increases, and an area where the acceleration electrode 101 receives the radiant heat increases, heat input to the acceleration electrode 101 increases, and the temperature of the acceleration electrode 101 is likely to rise.

With the configuration, the acceleration electrode 101 can be heated to a high temperature, and a generation amount of ESD gas or ions can be reduced even when a part of the electron beam 129 collides with the acceleration electrode 101. As a result, the degree of vacuum of the first vacuum chamber 119 is not reduced, and the occurrence of discharge can be prevented, so that the electron beam can be stably supplied.

Since the heat transfer to the cylindrical body 125 is prevented by the heat insulating portion 201, the temperature rise of the condenser lens 110 whose heat resistance temperature is about 100° C. can be prevented. That is, even when the entire electron gun is heated to a high temperature by the outer heater 107 or the heater 103, a problem such as disconnection of the condenser lens 110 disposed below the acceleration electrode 101 can be prevented.

Further, although the reflected electrons 203 generated by collision of a part of the electron beam 129 with the acceleration electrode 101 are emitted toward the extraction electrode 102, the reflected electrons 203 are bent toward a center direction by a potential gradient generated by the Butler lens to collide with the acceleration electrode 101. Therefore, re-collision with a member which is not heated to a high temperature is prevented, and emission of secondary ESD gas and ions can be prevented. Further, charging of the insulating material such as the insulator 117 can be prevented.

A baking process according to the present embodiment will be described with reference to FIG. 3. First, the entire electron gun is heated to about 100° C. to about 300° C. by the outer heater 107, and baking is performed for about 1 hour to about 2 hours. Thereafter, the heater 103 is further operated, and the extraction electrode 102 is heated to about 300° C. to 700° C., and the baking is performed for about 2 hours to about 120 hours. During this period, the acceleration electrode 101 is heated to about 200° C. to about 500° C. by the radiant heat from the extraction electrode 102. Thereafter, the operation of the outer heater 107 is stopped, and the heating by only the heater 103 is performed for about 1 hour to about 2 hours to complete the baking process. Baking time is adjusted according to whether or not the degree of vacuum has reached a target value. The baking process is performed each time the electron source 104 of the electron gun is replaced.

By performing such a baking process before the electron gun is used, the ESD gas or the like is thermally desorbed from the acceleration electrode 101 as well as the extraction electrode 102, so that the decrease in the degree of vacuum and the occurrence of discharge can be prevented during electron beam irradiation, and the electron beam can be stably supplied.

Second Embodiment

In the first embodiment, it has been described that the reflected electrons 203 generated from the acceleration electrode 101 are made to collide with the acceleration electrode 101 by a potential gradient generated by the Butler lens to prevent dissipation of the reflected electrons 203. In the present embodiment, it will be described that the dissipation of the reflected electrons 203 generated from the acceleration electrode 101 is further prevented by changing a structure of the acceleration electrode 101. A configuration other than the acceleration electrode 101 is the same as that of the first embodiment, and a description thereof will be omitted.

Figure 4:
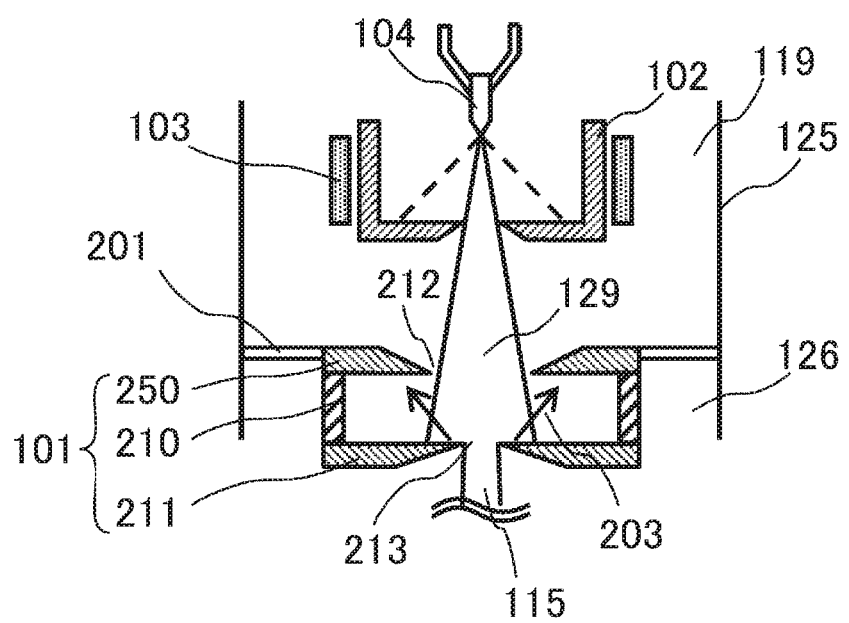
FIG. 4 is a schematic view showing a configuration of the periphery of an acceleration electrode according to a second embodiment.

The acceleration electrode 101 according to the present embodiment will be described with reference to FIG. 4. The acceleration electrode 101 according to the present embodiment includes a first annular portion 250, a cylindrical portion 210, and a second annular portion 211. Each portion will be described below.

The first annular portion 250 is a metal annular ring having a first opening 212 at a center, and is disposed below the extraction electrode 102 so as to face the extraction electrode 102. The first opening 212 has a diameter large enough to allow the electron beam 129 to pass therethrough without colliding with the first annular portion 250. The first annular portion 250 is connected to the cylindrical body 125 via the heat insulating portion 201 disposed on the outer periphery of the first annular portion 250. A material of the heat insulating portion 201 is similar to that in the first embodiment.

The cylindrical portion 210 is a cylindrical member having the same outer diameter as the first annular portion 250, and is connected to a lower surface of the first annular portion 250, that is, a surface on a side of the sample 112. An inner diameter of the cylindrical portion 210 is sufficiently larger than a diameter of the first opening 212 so that the electron beam 129 does not collide with the cylindrical portion 210.

The second annular portion 211 is a metal ring having a second opening 213 with a diameter of about 0.1 mm to about 10 mm at a center, has the same outer diameter as the first annular portion 250 and the cylindrical portion 210, and is connected to a lower surface of the cylindrical portion 210, that is, a surface on a side of the sample 112 so as to face the first annular portion 250. The second annular portion 211 is set at the same potential as the first annular portion 250 such that an electrostatic lens function does not occur between the first annular portions 250 and the second annular portion 211. A part of the electron beam 129 that reaches the second annular portion 211 without colliding with the first annular portion 250 or the cylindrical portion 210 passes through the second opening 213 and travels to the second vacuum chamber 126 as the electron beam 115. The first vacuum chamber 119 in which the acceleration electrode 101 is disposed is differentially evacuated to the second vacuum chamber 126 connected via the second opening 213. The second opening 213 is precisely machined to have a perfect circular shape, and an outer peripheral portion of the electron beam 129 is uniformly shielded to make a shape of the electron beam 115 a perfect circle. As a result, the final electron beam focused on the sample 112 can also be kept in a perfect circle, and the resolution can be improved. In order to perform the precision machining, a hard material such as molybdenum or SUS is used for the second annular portion 211.

Since the acceleration electrode 101 having the first annular portion 250, the cylindrical portion 210, and the second annular portion 211 is connected to the cylindrical body 125 via the heat insulating portion 201, the acceleration electrode 101 is heated to a high temperature by the outer heater 107 or radiant heat of the extraction electrode 102 heated by the heater 103. As a result, similarly to the acceleration electrode 101 according to the first embodiment, ESD gas or the like is thermally desorbed from the acceleration electrode 101 according to the present embodiment, emission of ESD gas, ions, and reflected electrons is prevented even when ESD occurs during electron beam irradiation, and the electron beam from the electron gun can be stably supplied.

In the acceleration electrode 101 according to the present embodiment, since the electron beam 129 reaches the second annular portion 211 without colliding with the first annular portion 250 and the cylindrical portion 210, the reflected electrons by the electron beam 129 are not generated in the first annular portion 250 and the cylindrical portion 210. The reflected electrons 203 generated by the electron beam 129 that collides with the second annular portion 211 around the second opening 213 are confined in a space surrounded by the first annular portion 250, the cylindrical portion 210, and the second annular portion 211, and disappear after collision with any inner wall is repeated. In the acceleration electrode 101 having the first annular portion 250, the cylindrical portion 210, and the second annular portion 211, since the ESD gas or the like is thermally desorbed by heating the outer heater 107 and the like, emission of ESD gas, ions, and reflected electrons is prevented even when the reflected electrons 203 repeatedly collide. As a result, since the reflected electrons 203 traveling to the extraction electrode 102 side than the first opening 212 are reduced and dissipation of the reflected electrons 203 into an acceleration space between the extraction electrode 102 and the acceleration electrode 101 is prevented, secondary generated ESD gas or the like is reduced, and the electron beam from the electron gun can be stably supplied.

Figure 5A:
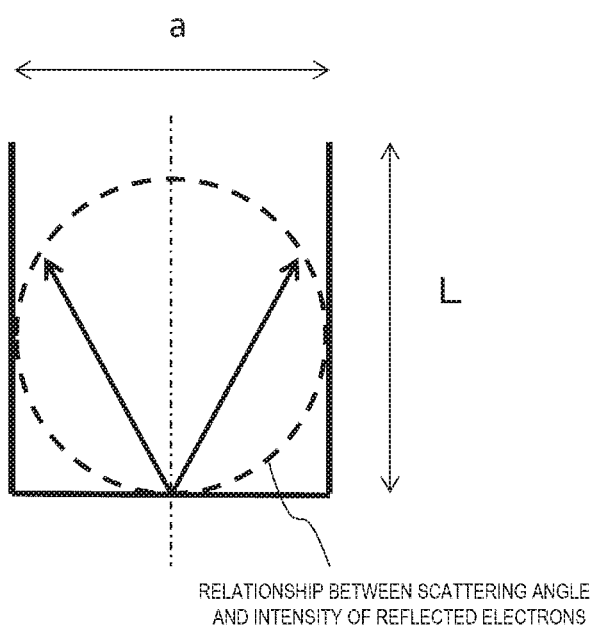
FIGS. 5A and 5B are diagrams explaining a relationship between an aspect ratio and a reflected electron of the acceleration electrode according to the second embodiment.
Figure 5B:
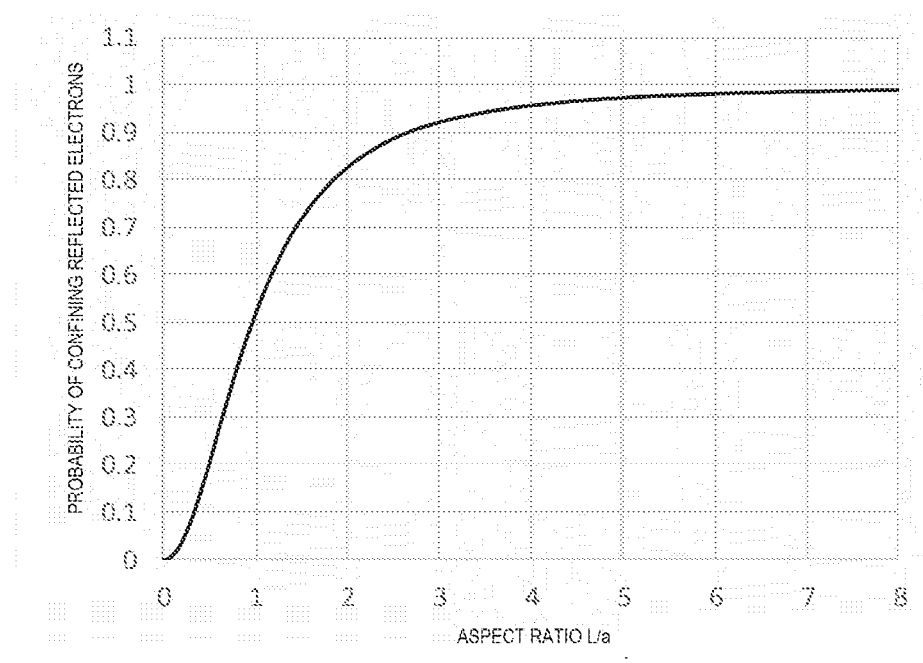

A relationship between probability of confining the reflected electrons 203 in a space surrounded by the first annular portion 250, the cylindrical portion 210, and the second annular portion 211 and an aspect ratio of the acceleration electrode 101 which is a ratio L/a of an axial length L of the cylindrical portion 210 to a diameter a of the first opening 212 will be described with reference to FIG. 5. FIG. 5A is a schematic view showing a relationship between a scattering angle and an intensity of the reflected electrons 203. In addition to the relationship in FIG. 5A, FIG. 5B is a graph in which a track of the reflected electrons 203 is simulated in consideration of an acceleration condition of the electron beam (acceleration voltage 15 kV to 60 kV), a material of the second annular portion 211 (molybdenum and SUS), and a potential distribution, and is summarized in the relationship between the probability of confining the reflected electrons 203 and the aspect ratio L/a of the accelerating electrode 101.

As shown by a dotted line in FIG. 5A, the reflected electrons 203 are emitted in the relationship between the scattering angle and the intensity according to a cosine law. Therefore, as the aspect ratio L/a increases, the reflected electrons 203 striking an inner wall of the cylindrical portion 210 increase, and the reflected electrons 203 passing through the first opening 212 decrease. As a result, as shown in FIG. 5B, the probability of confining the reflected electrons 203 increases as the aspect ratio L/a increases. Since the diameter a of the first opening 212 is set to a predetermined size or more so as not to cause the electron beam 129 to collide with the first annular portion 250, it is necessary to increase the axial length L of the cylindrical portion 210 in order to increase the aspect ratio L/a.

However, since it becomes difficult to mount the cylindrical portion 210 on a scanning electron microscope when the length L is too long, when ease of mounting is more emphasized than the probability of confining the reflected electrons 203, the aspect ratio L/a is preferably set to about 1 to 4. According to FIG. 5B, when the aspect ratio L/a is 1, 2, 3 and 4, the reflected electrons 203 of 52%, 83%, 92% and 96% can be confined, respectively. Therefore, by setting the aspect ratio to about 1 to 4, a sufficient effect can be exhibited in a relatively small structure. The reflected electrons 203 passing through the first opening 212 are pulled back to the first annular portion 250 side by the potential of the acceleration space, and are further focused by the Butler lens and return to the inside of the acceleration electrode 101. Therefore, a ratio at which the reflected electrons 203 dissipate to the acceleration space is further reduced.

When the probability of confining the reflected electrons 203 is more emphasized than the ease of mounting, the aspect ratio L/a may be increased, and, for example, if the aspect ratio L/a is 5 to 8, the reflected electrons of 97% to 99% are confined.

Further, an upper surface which is a surface of the second annular portion 211 on an electron source 104 side is a flat surface, and on a lower surface which is a surface on a sample 112 side, a taper is provided around the second opening 213, and a thickness of an inner peripheral surface of the second opening 213 is made sufficiently thin. With such a configuration, the reflected electrons 203 can be prevented from passing through the second opening 213 to the second vacuum chamber 126. Since the reflected electrons 203 passing through the second opening 213 become flares to obscure the image for observation, an image quality of the image for observation can be maintained by blocking the passage of the reflected electrons 203.

Figure 6:
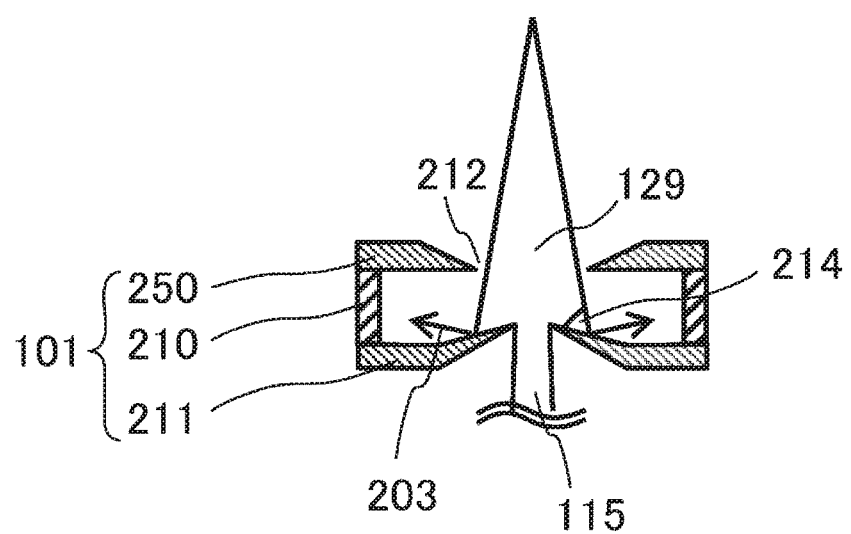
FIG. 6 is a schematic view showing a modification of the acceleration electrode according to the second embodiment.

Further, as shown in FIG. 6, an inclined surface having a high inner side, a so-called taper, may be formed around the second opening 213 on an upper surface of the second annular portion 211, and a collision angle 214 between the electron beam 129 and the second annular portion 211 may be reduced. Since most of the reflected electrons 203 emitted from the second annular portion 211 are directed to the inner peripheral surface of the cylindrical portion 210 by reducing the collision angle 214, the amount of the reflected electrons 203 that are dissipated into the acceleration space through the first opening 212 can be further reduced. Further, by reducing the collision angle 214, the reflected electrons 203 which become flares by passing through the second opening 213 can be further reduced.

Third Embodiment

In the second embodiment, the structure of the acceleration electrode 101 that further prevents dissipation of the reflected electrons 203 has been described. In the present embodiment, the acceleration electrode 101 that further prevents dissipation of the reflected electrons 203 and can be heated more efficiently will be described. A configuration other than the acceleration electrode 101 is the same as that of the first embodiment, and a description thereof will be omitted.

Figure 7:
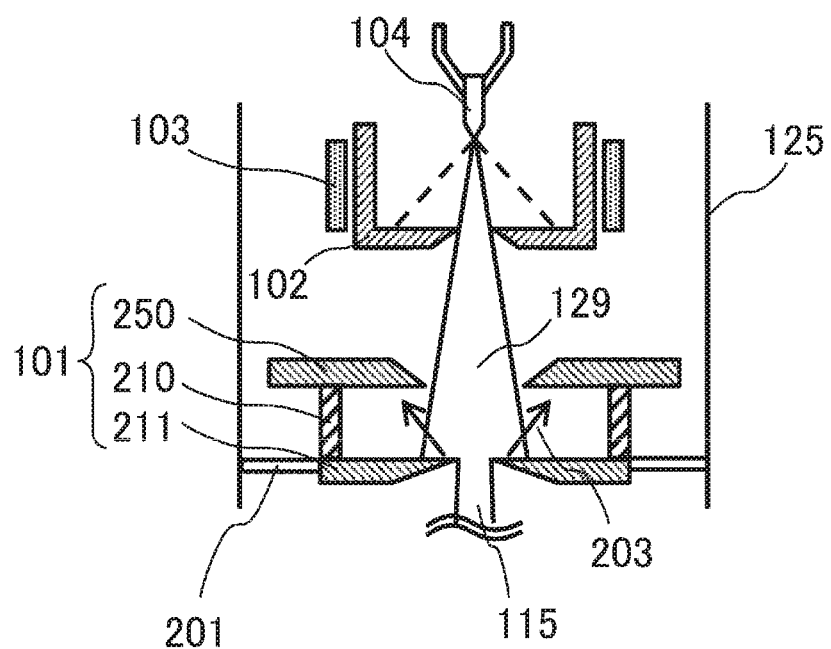
FIG. 7 is a schematic view showing a configuration of the periphery of an acceleration electrode according to a third embodiment.

The acceleration electrode 101 according to the present embodiment will be described with reference to FIG. 7. Similarly to the second embodiment, the acceleration electrode 101 according to the present embodiment includes the first annular portion 250, the cylindrical portion 210, and the second annular portion 211. Each portion will be described below.

Similarly to the second embodiment, the first annular portion 250 is a metal annular ring having the first opening 212 of a size that allows passage of the electron beam 129 without collision at a center, and is disposed below the extraction electrode 102 so as to face the extraction electrode 102. The first annular portion 250 according to the present embodiment has an outer diameter larger than that of the second embodiment, that is, an outer diameter larger than that of the cylindrical portion 210 and the second annular portion 211, and the heat insulating portion 201 is not disposed on the outer periphery.

The cylindrical portion 210 is a cylindrical member and is connected to the lower surface of the first annular portion 250. Similarly to the second embodiment, an inner diameter of the cylindrical portion 210 is sufficiently larger than a diameter of the first opening 212 so that the electron beam 129 does not collide with the cylindrical portion 210. The cylindrical portion 210 according to the present embodiment is preferably formed of a material having a low thermal conductivity, and is formed of, for example, SUS, titanium, a titanium alloy, alumina, zirconia, Ti-6Al-4V.

Similarly to the second embodiment, the second annular portion 211 is a metal annular ring having the second opening 213 with a diameter of about 0.1 mm to about 10 mm at a center, has the same outer diameter as the cylindrical portion 210, and is connected to the lower surface of the cylindrical portion 210 so as to face the first annular portion 250. The heat insulating portion 201 is disposed on the outer periphery of the second annular portion 211, and the second annular portion 211 is connected to the cylindrical body 125 via the heat insulating portion 201. A material of the heat insulating portion 201 is similar to that in the first embodiment. Similarly to the second embodiment, the second annular portion 211 is at the same potential as the first annular portion 250. Similarly to the second embodiment, when a part of the electron beam 129 passes through the second opening 213 and travels to the second vacuum chamber 126 as the electron beam 115, the first vacuum chamber 119 is differentially evacuated to the second vacuum chamber 126 connected via the second opening 213.

According to the present embodiment, the first annular portion 250 having an outer diameter larger than that of the second embodiment is susceptible to radiant heat from the extraction electrode 102, and a heat transfer path from the first annular portion 250 to the cylindrical body 125 is longer than that of the second embodiment, so that the first annular portion 250 is easily heated to a higher temperature. As a result, ESD gas or the like generated from the first annular portion 250 during electron beam irradiation can be further prevented, and the electron beam can be supplied more stably.

Fourth Embodiment

In a third embodiment, the acceleration electrode 101 that can be heated more efficiently by increasing an outer diameter of the first annular portion 250 and lengthening a heat transfer path from the first annular portion 250 to the cylindrical body 125 has been described. In the present embodiment, it is described that emissivity of the extraction electrode 102 and the acceleration electrode 101 is improved, and a reflective material is disposed around the extraction electrode 102. A configuration other than the acceleration electrode 101 and the extraction electrode 102 is the same as that of the first embodiment, and a description thereof will be omitted.

Figure 8:
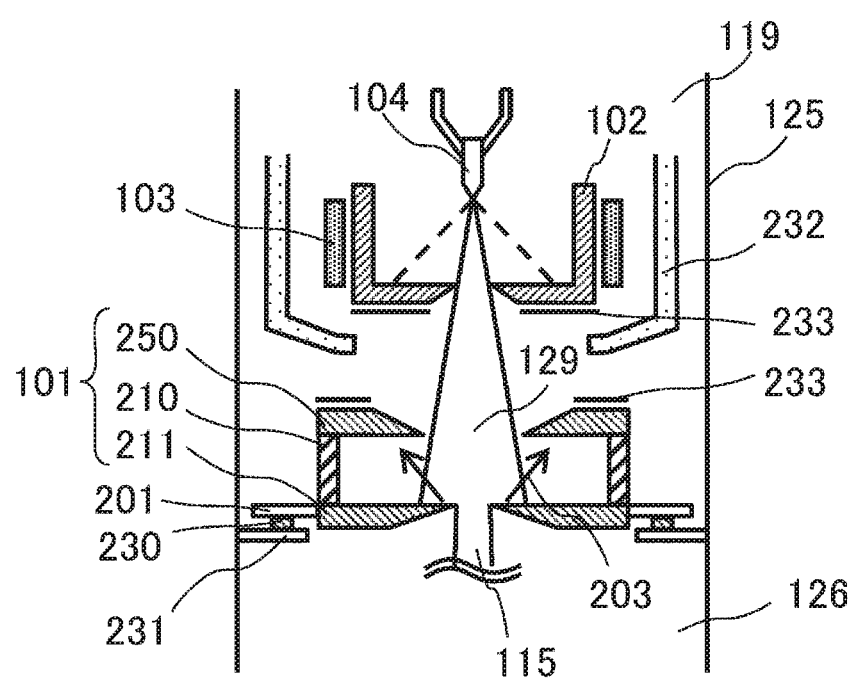
FIG. 8 is a schematic view showing a configuration of the periphery of an acceleration electrode according to a fourth embodiment.

The extraction electrode 102 and the acceleration electrode 101 according to the present embodiment will be described with reference to FIG. 8. Similarly to the first embodiment, the extraction electrode 102 according to the present embodiment has a cup shape covering the electron source 104, and has the opening 123 with a diameter of about 0.1 mm to about 10 mm at a center of a surface facing the electron source 104. A black body coating 233 is formed on a lower surface of the extraction electrode 102 according to the present embodiment, that is, a surface facing the acceleration electrode 101. The black body coating 233 is a carbon-based material, and is, for example, graphene, amorphous carbon, carbon nanotube. The extraction electrode 102 may be formed of a carbon-based material. A reflector 232 is provided in a space between the extraction electrode 102 and the cylindrical body 125. The reflector 232 is made of metal and has a cylindrical shape, and a mirror surface is formed on a surface facing the extraction electrode 102, and functions as a reflecting material that reflects heat. The reflector 232 is at the same potential as the extraction electrode 102 such that electrostatic lens function does not occur. Further, reflection function may be further enhanced by forming a multilayer film of which a film thickness is controlled according to a material having a low emissivity, such as gold or TiN, or a wavelength of radiant heat, on a surface of the reflector 232.

Similarly to the second embodiment, the acceleration electrode 101 according to the present embodiment includes the first annular portion 250, the cylindrical portion 210, and the second annular portion 211. Each portion will be described below.

Similarly to the second embodiment, the first annular portion 250 is a metal annular ring having the first opening 212 of a size that allows passage of the electron beam 129 without collision at a center, and is disposed below the extraction electrode 102 so as to face the extraction electrode 102. The black body coating 233 is formed on an upper surface of the first annular portion 250 according to the present embodiment, that is, a surface facing the extraction electrode 102, similarly to a lower surface of the extraction electrode 102. Similarly to the extraction electrode 102, the first annular portion 250 may be formed of a carbon-based material.

The cylindrical portion 210 is a cylindrical member and is connected to a lower surface of the first annular portion 250. Similarly to the second embodiment, the cylindrical portion 210 has an inner diameter sufficiently larger than a diameter of the first opening 212 so that the electron beam 129 does not collide with the cylindrical portion 210, and the same outer diameter as that of the first annular portion 250. Similarly to the third embodiment, the cylindrical portion 210 according to the present embodiment is preferably formed of a material having a low thermal conductivity, such as Ti-6Al-4V.

Similarly to the third embodiment, the second annular portion 211 is a metal annular ring having the second opening 213 with a diameter of about 0.1 mm to about 10 mm at a center, has the same outer diameter as that of the cylindrical portion 210, and is connected to the lower surface of the cylindrical portion 210 so as to face the first annular portion 250. The heat insulating portion 201 is disposed on the outer periphery of the second annular portion 211. A material of the heat insulating portion 201 is similar to that in the first embodiment.

The heat insulating portion 201 is connected to a cylindrical body side heat insulating portion 231 via a vacuum seal 230. An oxygen-free copper gasket, a metal O-ring, a helicoflex, or the like of a conflat flange is used as the vacuum seal 230. The cylindrical body side heat insulating portion 231 is connected to the cylindrical body 125, is formed of the same material as the heat insulating portion 201, and has an annular shape. The first vacuum chamber 119 is separated from the second vacuum chamber 126 by the second annular portion 211, the heat insulating portion 201, the vacuum seal 230, and the cylindrical body side heat insulating portion 231, and is differentially evacuated to the second vacuum chamber 126 via the second opening 213.

According to the present embodiment, an emission amount and an absorption amount of radiant heat on surfaces of the extraction electrode 102 on which the black body coating 233 is formed and the acceleration electrode 101 increase, and the radiant heat is reflected by the reflector 232, so that the extraction electrode 102 and the acceleration electrode 101 are more easily heated. Further, since the acceleration electrode 101 is connected to the cylindrical body 125 via the heat insulating portion 201, the vacuum seal 230, and the cylindrical body side heat insulating portion 231, heat transfer from the acceleration electrode 101 to the cylindrical body 125 is further prevented, and the acceleration electrode 101 is more easily heated. As a result, ESD gas or the like generated from the extraction electrode 102 and the acceleration electrode 101 can be further prevented during irradiation of the electron beam, and the electron beam can be supplied more stably.

Fifth Embodiment

In a second embodiment, a structure of the acceleration electrode 101 that further prevents dissipation of the reflected electrons 203 has been described. In the present embodiment, the acceleration electrode 101 that further prevents dissipation of the reflected electrons 203 and further improves a degree of vacuum will be described. A configuration other than the acceleration electrode 101 is the same as that of the first embodiment, and a description thereof will be omitted.

Figure 9:
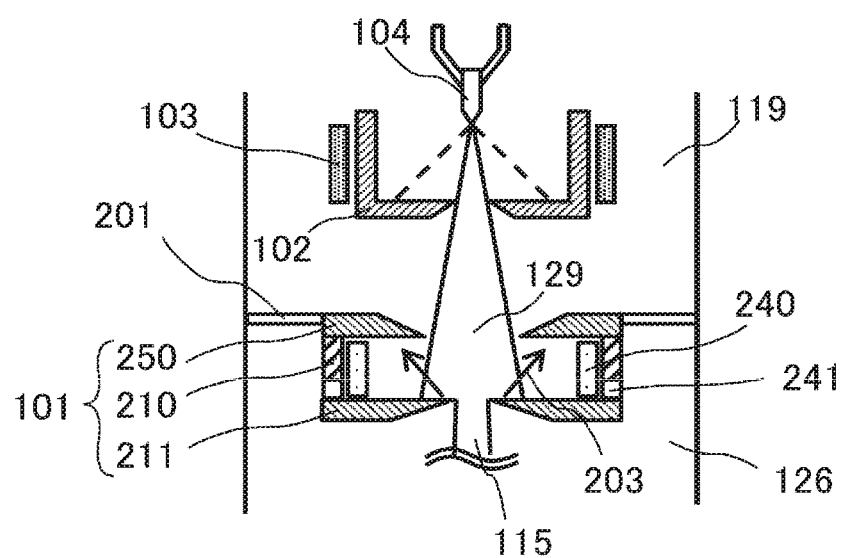
FIG. 9 is a schematic view showing a configuration of the periphery of an acceleration electrode according to a fifth embodiment.

The acceleration electrode 101 according to the present embodiment will be described with reference to FIG. 9. The acceleration electrode 101 according to the present embodiment has the first annular portion 250, the cylindrical portion 210, and the second annular portion 211, and the first annular portion 250 and the second annular portion 211 are similar to those in the second embodiment. The cylindrical portion 210 according to the present embodiment will be described below.

The cylindrical portion 210 is a cylindrical member having an inner diameter of a size that does not cause collision with the electron beam 129 and the same outer diameter as the first annular portion 250 and the second annular portion 211, and is connected to a lower surface of the first annular portion 250. An NEG pump 240 is disposed inside the cylindrical portion 210 and at a position where the electron beam 129 does not collide with the cylindrical portion 210. The NEG pump 240 is a vacuum pump that emits gas by activation by heating and adsorbs residual gas by the emitted gas, and is, for example, a sintered pellet or sheet. The NEG pump 240 may be directly coated on the inner wall of the cylindrical portion 210 or the lower surface of the first annular portion 250.

A diffusion port 241 is provided on a side surface of the cylindrical portion 210, and gas emitted from the NEG pump 240 is diffused to the second vacuum chamber 126 through the diffusion port 241. Since the NEG pump 240 is activated by heating in the baking process of the electron gun, a heater used for the NEG pump 240 may not be newly provided.

According to the present embodiment, the degree of vacuum of the first vacuum chamber 119 and the second vacuum chamber 126 can be further improved by the NEG pump 240 disposed inside the cylindrical portion 210. Due to the improvement in the degree of vacuum, ESD gas or the like generated from the acceleration electrode 101 during electron beam irradiation can be further prevented, and the electron beam can be supplied more stably.

Sixth Embodiment

In a fifth embodiment, a degree of vacuum of the first vacuum chamber 119 and the second vacuum chamber 126 is improved by the NEG pump 240 disposed inside the cylindrical portion 210. In the present embodiment, the acceleration electrode 101 that can be further heated will be described. A configuration other than the acceleration electrode 101 is the same as that of the first embodiment, and a description thereof will be omitted.

Figure 10:
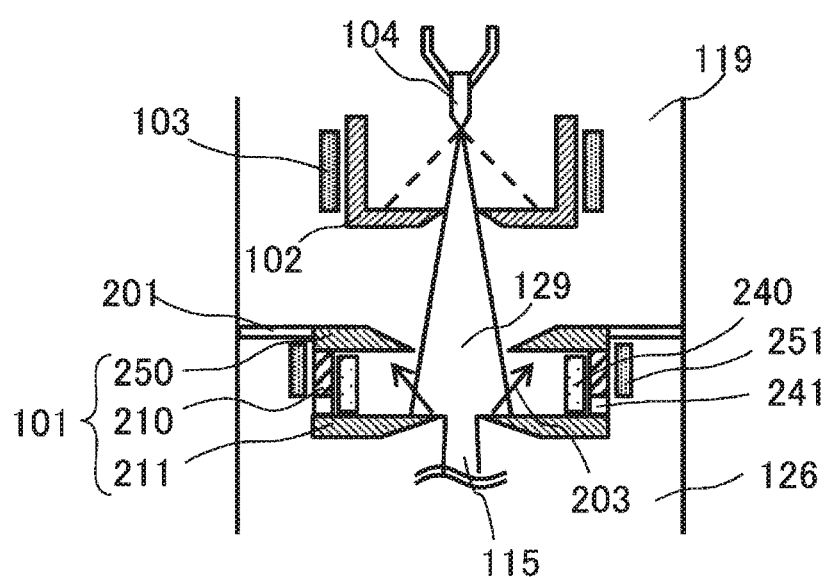
FIG. 10 is a schematic view showing a configuration of the periphery of an acceleration electrode according to a sixth embodiment.

The acceleration electrode 101 according to the present embodiment will be described with reference to FIG. 10. The acceleration electrode 101 according to the present embodiment is configured by adding a heater 251 to the fifth embodiment. The heater 251 is provided on the outer periphery of the cylindrical portion 210 of the acceleration electrode 101 so as to avoid the diffusion port 241 in order to heat the acceleration electrode 101. By providing the heater 251, heating of the acceleration electrode 101 is facilitated. As a result, ESD gas or the like generated from the acceleration electrode 101 during electron beam irradiation can be further prevented, and the electron beam can be supplied more stably.

Figure 11:
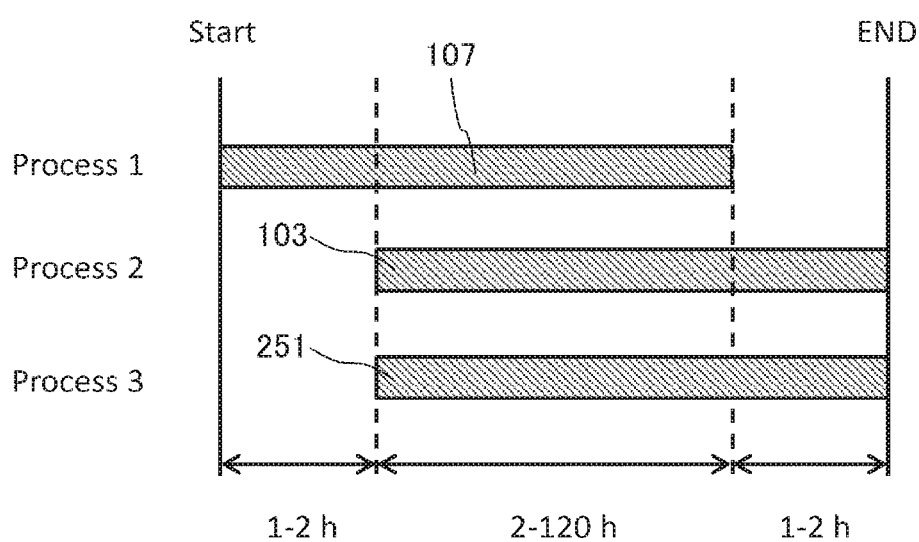
FIG. 11 is a diagram explaining a baking process according to the sixth embodiment.

A baking process according to the present embodiment will be described with reference to FIG. 11. First, the entire electron gun is heated to about 100° C. to 300° C. by the outer heater 107, and baking is performed for about 1 hour to about 2 hours. Thereafter, the heater 103 and the heater 251 are further operated, the extraction electrode 102 is heated to about 300° C. to 700° C., the acceleration electrode 101 is heated to about 200° C. to 600° C., and baking is performed for about 2 hours to 120 hours. Thereafter, an operation of the outer heater 107 is stopped, and the heating by the heater 103 and the heater 251 is performed for about 1 hour to about 2 hours to complete the baking process. Baking time is adjusted according to whether or not the degree of vacuum has reached a target value. The baking process is performed each time the electron source 104 of the electron gun is replaced.

By performing such a baking process before the electron gun is used, ESD gas or the like is thermally desorbed from the acceleration electrode 101 as well as the extraction electrode 102, so that a decrease in the degree of vacuum and occurrence of discharge can be prevented during electron beam irradiation, and the electron beam can be stably supplied.

Seventh Embodiment

In the first embodiment, heating of the entire electron gun by the outer heater 107 and the heater 103 has been described. In the present embodiment, addition of a control electrode, which is an electrode used for controlling a position of a virtual light source, to the electron gun will be described. A configuration other than the electron gun is the same as that of the first embodiment, and a description thereof will be omitted.

Figure 12:
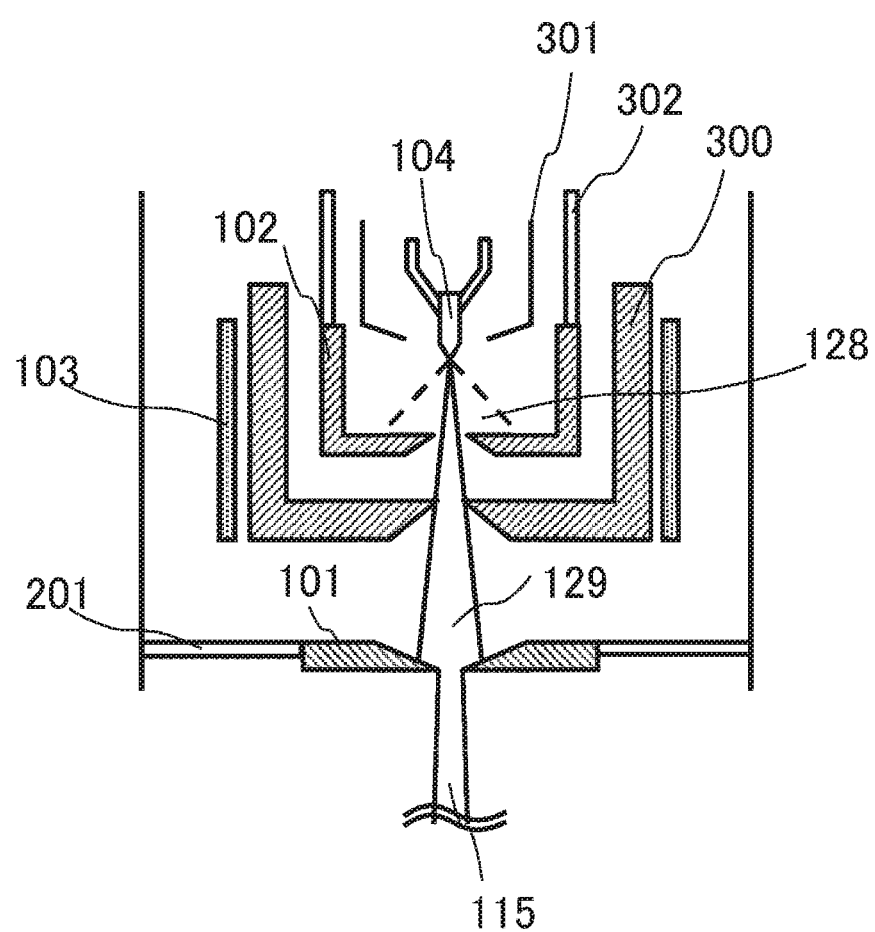
FIG. 12 is a schematic view showing a configuration of the periphery of an acceleration electrode according to a seventh embodiment.

An electron gun according to the present embodiment will be described with reference to FIG. 12. The electron gun according to the present embodiment is configured by adding a control electrode 300, a suppressor 301, and a heat insulating portion 302 to the first embodiment. The control electrode 300, the suppressor 301, and the heat insulating portion 302 will be specifically described below.

The control electrode 300 is provided below the extraction electrode 102, has a cup shape covering the extraction electrode 102, and is provided with an opening having a size that allows the electron beam 129 to pass through at a center of a surface facing the extraction electrode 102. A voltage of about 0 kV to 15 kV is applied as a control voltage between the control electrode 300 and the electron source 104 in order to control the position of the virtual light source. By keeping the position of the virtual light source constant, overall magnification of an optical diameter is also constant, and reproducibility of an image for observation is improved. The heater 103 is disposed on the outer periphery of the control electrode 300, and the acceleration electrode 101 is provided below the control electrode 300.

The suppressor 301 is provided around the electron source 104 to prevent unnecessary electrons from being extracted from the electron source 104.

The heat insulating portion 302 is connected to the extraction electrode 102, and prevents heat transfer from the extraction electrode 102 to the cylindrical body 125. A material and a thickness of the heat insulating portion 302 are the same as those of the heat insulating portion 201. When the heat insulating portion 302 is formed of an insulating material, a surface of the heat insulating portion 302 is coated with metal or the heat insulating portion 302 is placed at a position where the total current 128 cannot collide to prevent the heat insulating portion 302 from being charged.

Figure 3:
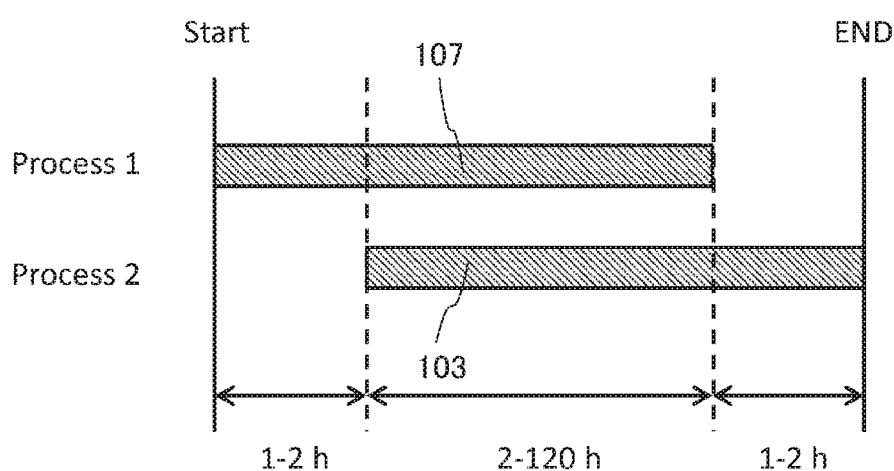
FIG. 3 is a diagram explaining a baking process according to the first embodiment.

In the electron gun according to the present embodiment, similarly to the first embodiment, the baking process shown in FIG. 3 is performed. That is, after the entire electron gun is heated to about 100° C. to about 300° C. by the outer heater 107 and baking is performed for about 1 hour to about 2 hours, the heater 103 is further operated to heat the control electrode 300 to 300° C. to 700° C., and baking is performed for about 2 hours to 120 hours. During this time, the extraction electrode 102 and the acceleration electrode 101 are heated to about 200° C. to 500° C. by radiant heat from the control electrode 300. Thereafter, an operation of the outer heater 107 is stopped, and the heating by only the heater 103 is performed for about 1 hour to about 2 hours to complete the baking process. The baking process is performed each time the electron source 104 of the electron gun is replaced, and baking time is adjusted according to whether a degree of vacuum has reached a target value.

By performing such a baking process before the electron gun is used, even when the control electrode 300 is added to the electron gun, ESD gas or the like emitted from the electron gun during electron beam irradiation can be prevented, and the electron beam can be stably supplied.

The invention is not limited to the above embodiments, and includes various modifications. For example, the electron source 104 according to the invention may be a cold cathode field emission electron source, a schottky electron source, a thermionic emission electron source, or a thermionic source. Further, a material of the electron source 104 may be other materials such as tungsten, LaB6, CeB6, a carbon-based material. In addition, the embodiments described above have been described in detail for easy understanding of the invention, and the invention is not necessarily limited to those including all the configurations described above. A part of the configuration of one embodiment can be replaced with the configuration of another embodiment, and the configuration of another embodiment can be added to the configuration of one embodiment. A part of the configuration of each embodiment may be added, deleted, or replaced with another configuration.

What is claimed is:

1. A charged particle beam device comprising:
   an electron gun having an electron source, an extraction electrode to which a voltage used for extracting electrons from the electron source is applied, and an acceleration electrode to which a voltage used for accelerating the electrons extracted from the electron source is applied;
   a first heating unit that heats the extraction electrode; and
   a second heating unit that heats the acceleration electrode; and
   a heat insulating portion that is provided between the acceleration electrode and a cylindrical body that houses the electron source, the extraction electrode and the acceleration electrode, and prevents hear transfer from the acceleration electrode to the cylindrical body,
   wherein the heat insulating portion is a titanium alloy.

2. The charged particle beam device according to claim 1, wherein the titanium alloy is Ti-6Al-4V.

3. The charged particle beam device according to claim 1, wherein
   a black body coating is formed on a surface where the extraction electrode and the acceleration electrode face each other.

4. The charged particle beam device according to claim 1, further comprising:
   a control electrode that is disposed to cover the extraction electrode and to which a voltage used for controlling a position of a virtual light source is applied, wherein
   the first heating unit heats the extraction electrode by heating the control electrode.

5. A charged particle beam device comprising:
   an electron gun having an electron source, an extraction electrode to which a voltage used for extracting electrons from the electron source is applied, and an acceleration electrode to which a voltage used for accelerating the electrons extracted from the electron source is applied;
   a first heating unit that heats the extraction electrode; and
   a second heating unit that heats the acceleration electrode,
   wherein the acceleration electrode includes a first annular portion that is disposed on a side of the electron source and has an annular shape, a second annular portion that is disposed on a side of a sample irradiated with accelerated electrons, and a cylindrical portion that is disposed between the first annular portion and the second annular portion and has a cylindrical shape, and
   wherein a size of an opening of the first annular portion is equal to or greater than a size of an opening of the second annular portion, and is smaller than an inner diameter of the cylindrical portion.

6. The charged particle beam device according to claim 5, wherein
   a value obtained by dividing a axial length of the cylindrical portion by the size of the opening of the first annular portion is 1 or more.

7. The charged particle beam device according to claim 5, wherein
   an inclined surface having a high inner side is formed around the opening of the second annular portion.

8. The charged particle beam device according to claim 5 further comprising:
   a heat insulating portion that is provided between the second annular portion and a cylindrical body that accommodates the electron source, the extraction electrode and the acceleration electrode, and prevents heat transfer from the acceleration electrode to the cylindrical body, wherein
   an outer diameter of the first annular portion is larger than an outer diameter of the cylindrical portion or the second annular portion.

9. The charged particle beam device according to claim 8, wherein
   the heat insulating portion includes a vacuum seal.

10. The charged particle beam device according to claim 5, wherein
    an NEG pump is disposed inside the acceleration electrode.

11. The charged particle beam device according to claim 10, wherein
    a diffusion port is provided on a side surface of the cylindrical portion.

12. The charged particle beam device according to claim 5, wherein
    a heater is disposed on the outer periphery of the cylindrical portion.

13. A charged particle beam device comprising:
    an electron gun having an electron source, an extraction electrode to which a voltage used for extracting electrons from the electron source is applied, and an acceleration electrode to which a voltage used for accelerating the electrons extracted from the electron source is applied;
    a first heating unit that heats the extraction electrode; and
    a second heating unit that heats the acceleration electrode, wherein
    an exhaust port is provided on a side surface of the extraction electrode, and
    the first heating unit is provided to avoid the exhaust port.

* * * * *